United States Patent
Sassa

[19]

[11] Patent Number: 6,098,077
[45] Date of Patent: Aug. 1, 2000

[54] DATA MANAGEMENT APPARATUS, DATA MANAGEMENT METHOD, AND RECORDING MEDIUM

[75] Inventor: Akira Sassa, Saitama, Japan

[73] Assignee: Sony Corporation, Tokyo, Japan

[21] Appl. No.: 09/099,871

[22] Filed: Jun. 19, 1998

[30] Foreign Application Priority Data

Jun. 20, 1997 [JP] Japan ................................ P09-164730
Sep. 30, 1997 [JP] Japan ................................ P09-267175

[51] Int. Cl.[7] .................................................. G06F 12/00
[52] U.S. Cl. ................................................ 707/202; 714/5
[58] Field of Search ........................... 386/117; 348/231, 348/372, 552; 707/202, 205; 714/5, 6, 15, 21

[56] References Cited

U.S. PATENT DOCUMENTS

| | | | |
|---|---|---|---|
| 5,153,729 | 10/1992 | Saito ........................................ | 348/372 |
| 5,479,609 | 12/1995 | Hsu et al. .................................. | 714/8 |
| 5,600,821 | 2/1997 | Falik et al. ............................... | 711/173 |
| 6,031,964 | 2/2000 | Anderson ................................. | 386/117 |

FOREIGN PATENT DOCUMENTS 0528280  2/1993  European Pat. Off. .

OTHER PUBLICATIONS

"The Development of a Memory CardSystem for a Digital Still Camera", Konishi et al., IEEE, pp. 824–829, Oct. 1992.

*Primary Examiner*—Thomas G. Black
*Assistant Examiner*—John Loomis
*Attorney, Agent, or Firm*—Jay H. Maioli

[57] ABSTRACT

Distributed management information for management of a predetermined unit of data is stored in a redundant area of respective blocks of a flash memory, whereas collected management information for all-at-once management of the data is stored in a predetermined block of the flash memory. When using the flash memory, it is determined whether the collected management information has an error. If any error is detected, collected management information is created from the distributed management information in the redundant area of the respective blocks. If the aforementioned data is modified, the collected management information is re-created according to the distributed management information of the redundant area of the respective blocks so that the collected management information is stored in the aforementioned predetermined block.

18 Claims, 15 Drawing Sheets

| OS HEADER | NUMBER OF BYTES |
|---|---|
| FILE ID | 2 |
| FILE VERSION | 2 |
| FILE SIZE | 4 |
| NUMBER OF BLOCKS USED | 2 |
| NUMBER OF LINKS | 1 |
| SYSTEM RESERVE | 1 |
| DATA (WHEN CREATED OR UPDATED) | 8 |
| MANUFACTURER / MODEL CODE | 4 |
| INITIAL LOADING DIRECTORY NUMBER | 2 |
| NUMBER OF KEYWORDS LOADED | 1 |
| KEYWORD CHARACTER CODE | 1 |
| KEYWORD CHARACTER STRING | 32 |
| FILE NAME | 11 |
| RESERVE | 1 |
| 0 RESET RESERVE | 4 |
| RESERVE | 20 |
| INDIVIDUAL DATA MANAGED FOR EACH FILE ID | 32 |

FIG.7

| | NUMBER OF BYTES |
|---|---|
| SPECIFICATION IDENTIFICATION DATA | 8 |
| FILE SPECIFICATION IDENTIFICATION DATA | 8 |
| FILE ID | 2 |
| FILE VERSION | 2 |
| DATE OF APPLICATION CREATED | 8 |
| DATE OF APPLIFICATION UPDATED | 8 |
| CREATION MANUFACTURER/MODEL CODE | 4 |
| UPDATING MANUFACTURER/MODEL CODE | 4 |
| 0 RESET RESERVE | 16 |
| NUMBER OF DATA ENTRIES | 1 |
| NUMBER OF TABLES | 1 |
| RESERVED | 1 |
| CHARACTER CODE | 1 |
| TITLE CHARACTER STRING | 128 |
| RESERVED | 48 |

FILE HEADER 240 BYTES

FIG.8

| | NUMBER OF BYTES |
|---|---|
| START ADDRESS | 4 |
| DATA SIZE | 4 |
| DATA TYPE ID | 1 |
| RESERVED | 3 |
| START ADDRESS | 4 |
| DATA SIZE | 4 |
| DATA TYPE ID | 1 |
| RESERVED | 3 |
| START ADDRESS | 4 |
| DATA SIZE | 4 |
| DATA TYPE ID | 1 |
| RESERVED | 3 |
| START ADDRESS | 4 |
| DATA SIZE | 4 |
| DATA TYPE ID | 1 |
| RESERVED | 3 |

SYSTEM ENTRY LIST 48 BYTES

FIG.9

| | NUMBER OF BYTES |
|---|---|
| EMPTY BLOCK SEARCH POSITION (PHYSICAL ADDRESS) | 2 |
| RESERVED | 94 |

FIG.10

|  | BLOCK FLAG | | | | | |
|---|---|---|---|---|---|---|
| | | 8 BITS FOR ONE BLOCK ENTRY | | | | |
| PHYSICAL ADDRESS 0 | ENABLE/ DISABLED | BLOCK FLAG | BLOCK END FLAG | REFERENCE FLAG | SYSTEM FLAG | READ ONLY | MARKING |
| PHYSICAL ADDRESS 1 | ENABLE/ DISABLED | BLOCK FLAG | BLOCK END FLAG | REFERENCE FLAG | SYSTEM FLAG | READ ONLY | MARKING |
| PHYSICAL ADDRESS 2 | ENABLE/ DISABLED | BLOCK FLAG | BLOCK END FLAG | REFERENCE FLAG | SYSTEM FLAG | READ ONLY | MARKING |

FIG.11

| | |
|---|---|
| LOGICAL ADDRESS 0 | PHYSICAL ADDRESS |
| LOGICAL ADDRESS 1 | PHYSICAL ADDRESS |
| LOGICAL ADDRESS 2 | PHYSICAL ADDRESS |

BIT 15     RESERVED
BIT 14–0    PHYSICAL ADDRESS
WHEN NOT IN USE, 0xffff SPECIFIED
(INCLUDING A RESERVED AREA)

FIG.12

| | |
|---|---|
| LOGICAL ADDRESS 0 | LINKAGE LOGICAL ADDRESS |
| LOGICAL ADDRESS 1 | LINKAGE LOGICAL ADDRESS |
| LOGICAL ADDRESS 2 | LINKAGE LOGICAL ADDRESS |

BIT 15     RESERVED
BIT 14–0    LOGICAL ADDRESS TO BE LINKED
FOR MANAGEMENT OF LINKAGE INFORMATION
OF DISTRIBUTED MANAGEMENT INFORMATION
0xffff IF END BLOCK 0x0000 IS SET FOR LOGICAL ADDRESS NOT IN USE

LINKAGE TO LOGICAL ADDRESS 0 IS INHIBITED

FIG.13

DATA MANAGEMENT APPARATUS, DATA MANAGEMENT METHOD, AND RECORDING MEDIUM

BACKGROUND OF THE INVENTION

1. Field of the Invention

The present invention relates to a data management apparatus using, a data management method, and a recording medium which use a flash memory.

2. Description of the Prior Art

Conventionally, when an electronic apparatus such as a computer is used as a main storage apparatus, a memory apparatus is used to suffice a capacity of this main storage apparatus. As this storage apparatus, there can be exemplified a magnetic tape, magnetic disc, magneto-optical disc, paper tape, memory card, and the like. Among these apparatuses, the memory card is widely used for its comparatively high speed of transfer rate.

Moreover, this memory card is built in a still image pickup apparatus (so-called still camera) and in a camera of a video tape recorder, so as to be used as a storage apparatus for recording a pickup information.

The memory card includes memory means such as a semiconductor integrated circuit embedded in a case made from, for example, a synthetic resin. As the semiconductor integrated circuit, a flash memory (electrically erasable type programmable ROM (read only memory)) or the like is used.

In the memory apparatus such as the aforementioned memory card, a data management is carried out by way of a so-called distributed management method or a collected management method.

The distributed management method is realized as follows. Memory means for storing a data in a storage apparatus is divided into a data erase units such as blocks, and for each of the blocks there is provided a block management information such as a block flag, a logical address, and a linkage information, which are distributed and created for the respective blocks. Hereinafter, such management information items will be referred to as a distributed management information. In the distributed management method, when an electronic apparatus is activated for carrying out a data read-out and/or write-in from/to the aforementioned storage apparatus, firstly, the electronic apparatus collects the distributed management information items distributed in the respective blocks of the storage means and reads them into storage means of the electronic apparatus, so as to create a collected management table which enables to carry out an all-at-once management of the storage means of the storage apparatus, thus carrying out the data of the storage apparatus.

In a case when this distributed management method is used, upon modification of a data in the respective blocks in the storage means of the storage apparatus by a signal transmitted from the electronic apparatus, the distributed management information is also modified. Consequently, each time when the electronic apparatus is activated as has been described above, the latest distributed management information items are collected from the respective blocks of the storage means in the storage apparatus, so as to create a management table in the storage means of the electronic apparatus. That is, according to this distributed management method, for example, even if any of the blocks in the storage means in the storage apparatus is destroyed, upon next activation of the electronic apparatus, the distributed management information items excluding that of the destroyed block are collected, so as to create a collected management table in the storage means of the electronic apparatus. Consequently, in the distributed management method, even if any of the blocks in the storage means of the storage apparatus is destroyed, it is possible to carry out a data write-in and/or data read-out to/from the blocks not destroyed. That is, the distributed management method is comparatively tough against destruction because there will be no such case that write-in and/or read-out cannot be carried out to/from the entire storage means.

However, if the aforementioned distributed management method is applied to a storage apparatus having a large capacity and a plenty of blocks, when activating an electronic apparatus for carrying out a data write-in and/or read-out to/from the storage apparatus, it takes quite a time to create a collected management table in the electronic apparatus. Thus, activation of the electronic apparatus requires a plenty of time, preventing the high-speed processing.

The other method, i.e., the collected management method is realized as follows. The management information items such as a block flag, logical address, and linkage information of respective blocks in storage means of the storage apparatus is stored in a single place in the storage means, and a management information is created for all-at-once management of the data of the respective blocks. Hereinafter, such a management information will be referred to as a collected management information. When the electronic apparatus is activated for carrying out a data read-out and/or write-in from/to the aforementioned storage apparatus, the electronic apparatus reads out the aforementioned collected management information so as to create a collected management table in the storage means of the electronic apparatus, thus carrying out management of the data of the storage apparatus.

In a case when this collected management method is employed, upon activation of an electronic apparatus for a data write-in and/or data read-out to/from the storage apparatus, what is necessary for the electronic apparatus is to read out the collected management information, thus enabling to carry out the activation of the electronic apparatus in a short period of time, which in turn enables to realize a high-speed processing.

However, when carrying out management of a data of a storage apparatus by the aforementioned collected management method, if the collected management information in the storage means of the storage apparatus is destroyed, it becomes impossible to carry out a data write/in and/or read-out to/from the entire storage means. That is, this method is not tough for the data destruction. Moreover, according to the collected management method, each time a data of respective blocks is modified in the storage means of the storage apparatus, the entire collected management information need be modified for data consistency between the collected management information and each of the blocks. In order to rewrite a plenty of blocks, a plenty of time is required for modifying the collected management information, thus preventing a high-speed processing.

SUMMARY OF THE INVENTION

It is therefore an object of the present invention to provide a data management apparatus, a data management method, and a recording medium which are tough against destruction and enable a high-speed processing of a data.

The data management apparatus according to the present invention includes: storage means for storing an arbitrary data in a data storage area constituted by predetermined storage units, and storing in a distributed management information storage area a distributed management information for management of the data on a predetermined storage unit basis; and storing in a collected management information storage area a collected management information for all-at-once management of the data according to the distributed management information; and management means which determines upon activation whether the collected management information is valid, and if the collected management information is determined to be valid, management of the data is carried out according to the collected management information, and if the collected management information is determined to be invalid, management of the data is carried out according to the distributed management information.

The data management method according to the present invention includes: a step of storing an arbitrary data in a data storage area constituted by predetermined storage units; a step of storing in a distributed management information storage area a distributed management information for management of the data on a predetermined storage unit basis; a step of storing in a collected management information storage area a collected management information for all-at-once management of the data according to the distributed management information; a step of determining upon activation whether the collected management information is valid; and a step of management of the data according to the collected management information if the collected management information is determined to be valid, or according to the distributed management information if the collected management information is determined to be invalid.

The recording medium according to the present invention is characterized in storing an arbitrary data in a data recording area constituted by predetermined storage units and a distributed management information for all-at-once management of the data according to the distributed management information, in a collected management information storage area.

BRIEF DESCRIPTION OF THE DRAWINGS

FIG. 7 explains contents of an OS header of the aforementioned collected management file.

FIG. 8 explains contents of a file header in the aforementioned header.

FIG. 9 explains contents of a system entry list in the aforementioned header.

FIG. 10 explains contents of system information in the aforementioned header.

FIG. 11 explains contents of a bit map table of the aforementioned collected management file.

FIG. 12 explains contents of an address conversion table of the aforementioned collected management file.

FIG. 13 explains contents of a linkage information table of the aforementioned collected management file.

DETAILED DESCRIPTION OF THE PREFERRED EMBODIMENT

Hereinafter, description will be directed to embodiments of the present invention with reference to the attached drawings. The present invention is applied, as shown in FIG. 1 for example, to a memory card system 1 including a host computer 10 and a memory card 20.

It should be noted that here explanation will be given on a case of writing a video data transmitted from a host computer, to a memory card, but the same applies to a case of other data including an audio data.

Figure 1:
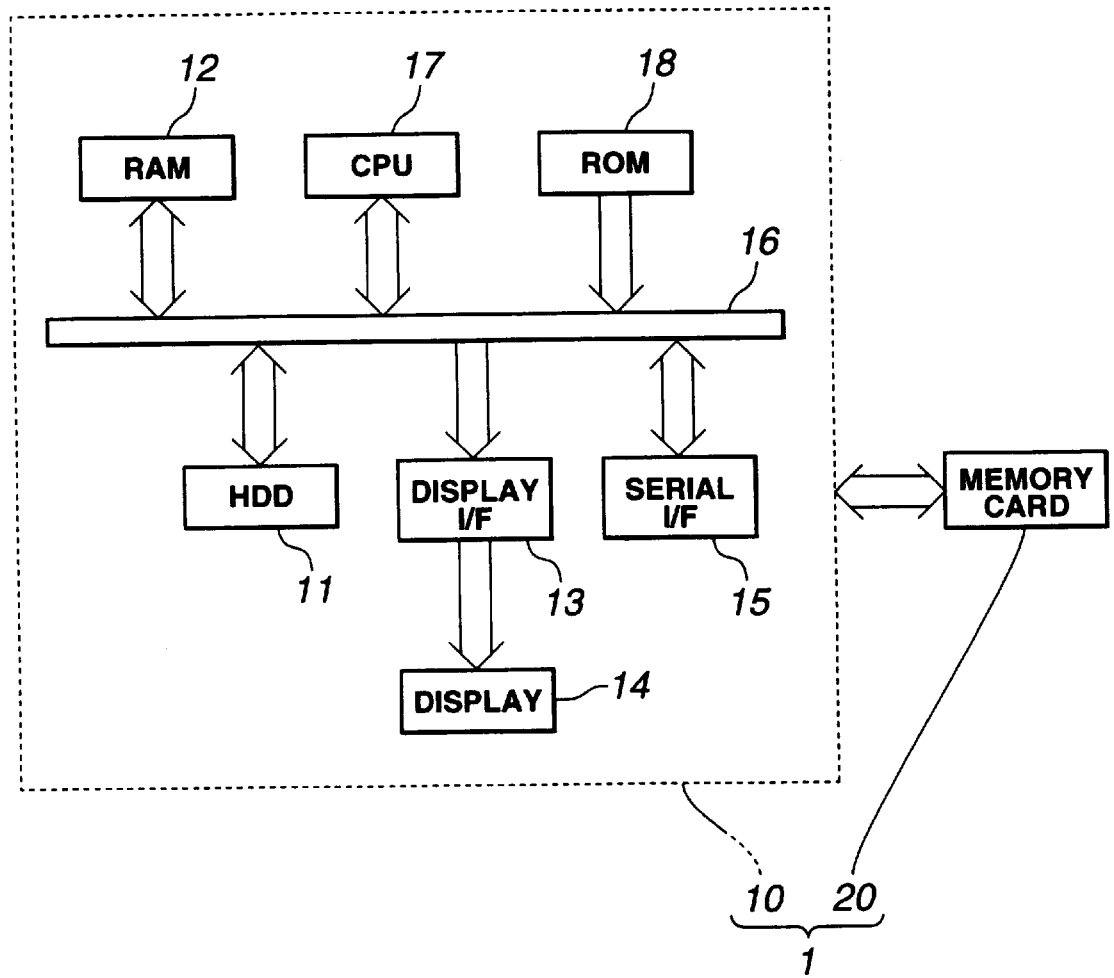
FIG. 1 is a block diagram showing a configuration of a memory card system according to the present invention.

As shown in FIG. 1, the aforementioned host computer 10 includes: a hard disc drive (hereinafter, referred to as HDD) for storing a video data of a still image and an audio data; a RAM (random access memory) 12 for temporarily storing and reading out a video data and the like from the HDD 11; a display interface (hereinafter, referred to as display I/F) 13; a display 14 for displaying an image according to the video data supplied via the display I/F 13; a serial interface (hereinafter, referred to as a serial I/F) 15 for carrying out a data transmission and reception via three lines with the memory card 20; a bus 16; a CPU (central processing unit) 17 for the entire system control; and a ROM (read only memory) 18 which contains a program data for controlling the CPU 17.

The RAM 12, for example, via the bus 16, temporarily stores an audio data and a video data stored in the HDD 11 and, when required, supplies the video data via the bus 16 to the serial I/F 15.

The display 14 is supplied with the video data read out from the HDD 11 via the bus 16 and the display I/F 13 as well as video data from the memory card 20, so as to display a still image according to these video data.

The serial I/F 15 transmits a video data to the memory card 20 and receives a video data from the memory card via the three lines. More specifically, via a first line, the serial I/F 15 transmits a video data and a control data for writing to the memory card 20 and receives a video data which has been read out from the memory card 20. Via a second line, the serial I/F 15 outputs a status signal indicating a switched state according to a switching between a video data and a control data in the first line. Furthermore, via a third line, the serial I/F 15 transmits a serial clock SCLK for transmitting the aforementioned control data and video data.

The CPU 17 controls read-out of a video data from the RAM 12 and the HDD 11 and write-in of a video data into the RAM 12 and the like as well as controls transmission and reception of a video data to/from the memory card 20. For example, the CPU 17 issues a data write-in to the memory card with specification of an address.

Figure 2:
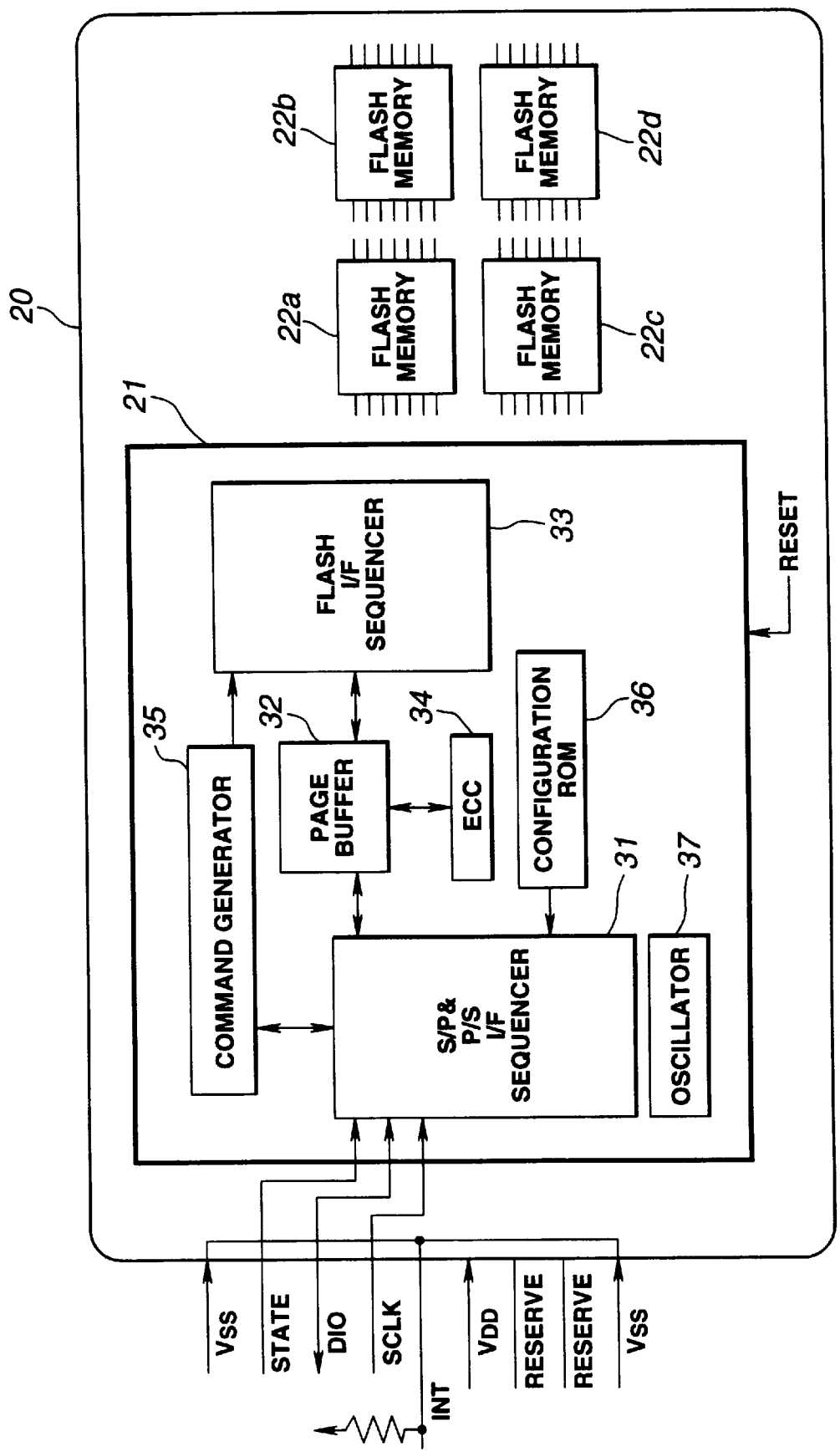
FIG. 2 is a block diagram showing a specific configuration of a memory card of the aforementioned memory card system.

As shown in FIG. 2, the memory card 20 in the present embodiment includes: a control IC 21 for receiving a video data and a control data from the aforementioned host computer 10; and a flash memory (electrically erasable type programmable ROM (read only memory)) 22a to 22d as storage means for storing the video data received.

The control IC 21, for includes: a serial/parallel—parallel/ serial interface sequencer (hereinafter, referred to as a sequencer) 31; a page buffer 32 for temporarily storing a video data from the sequencer 31; a flash interface sequencer (hereinafter, referred to as a flash I/F sequencer) 33 for supplying the flash memory 22a to 22d with a video data from the page buffer 32; an ECC encoder/decoder 34 for carrying out an error correction; a command generator 35 for generating a predetermined control command; a configuration ROM (read only memory) 36 containing a version information and the like; and an oscillator 37 for supplying a clock to respective circuits.

The sequencer 31 is connected via the aforementioned first to third lines to the serial I/F 15 of the host computer 10. Consequently, the sequencer 31 is supplied with a status signal and a serial clock SCLK as well as a serial DIO consisting of a video data and control data from the host computer 10.

The sequencer 31 converts the serial DIO supplied from the host computer 10, into a parallel data in synchronization with the aforementioned serial clock SCLK. Among the parallel data, the sequencer 31, for examples, supplies a control data to the command generator 35, and a video data to the page buffer 32.

The page buffer 32 is a buffer memory for storing each page of the video data supplied from the sequencer 31. The video data stored in the page buffer 32 is added with an error correction code by the ECC encoder/decoder 34. The page buffer 32 supplies one page of video data having the error correction code, via the flash I/F sequencer 33 to the flash memories 22a to 22d. Thus, the video data from the host computer 10 is written in the flash memories 22a to 22d.

Moreover, a video data read out from the flash memories 22a to 22d is supplied via the flash I/F sequencer 33 to the page buffer 32.

The page buffer 32 stores the video data from the flash I/F sequencer 33. Here, the ECC encoder/decoder 34 carries out an error correction processing according to the error correction code added to the data stored in the page buffer 32. The page buffer 32 reads out page after another of the data whose error has been corrected and supplies the data to the sequencer 31. The sequencer 31 converts the parallel video data supplied from the page buffer 32, into a serial data DIO which is transmitted to the aforementioned host computer 10.

The command generator 35, according to a control data from the sequencer 31, generates a control command. Moreover, the command generator 35 generates a Busy command (hereinafter, referred to as a busy signal) indicting that a video data is being written into the flash memory 22a to 22d or a video data is being read out from the flash memory 22a to 22d, and transmits the command via the sequencer 31 to the host computer 10. When the video data write-in or the data read-out is complete, the command generator 35 generates a Ready command (hereinafter, referred to as a ready signal) and transmits the command via the sequencer 31 to the host computer 10. The host computer receives the busy signal and the ready signal so as to recognize the operation state of the memory card 20.

The configuration ROM 36 contains a version information and an initial value information of the memory card 20. Consequently, when a connection is made between the host computer 10 and the memory card 20, the command generator 35, firstly, reads out the aforementioned version information and the like from the configuration ROM 36 via the sequencer 31, and according to this information, generates a predetermined command, so as to carry out a predetermined initialization of the memory card 20.

Figure 3:
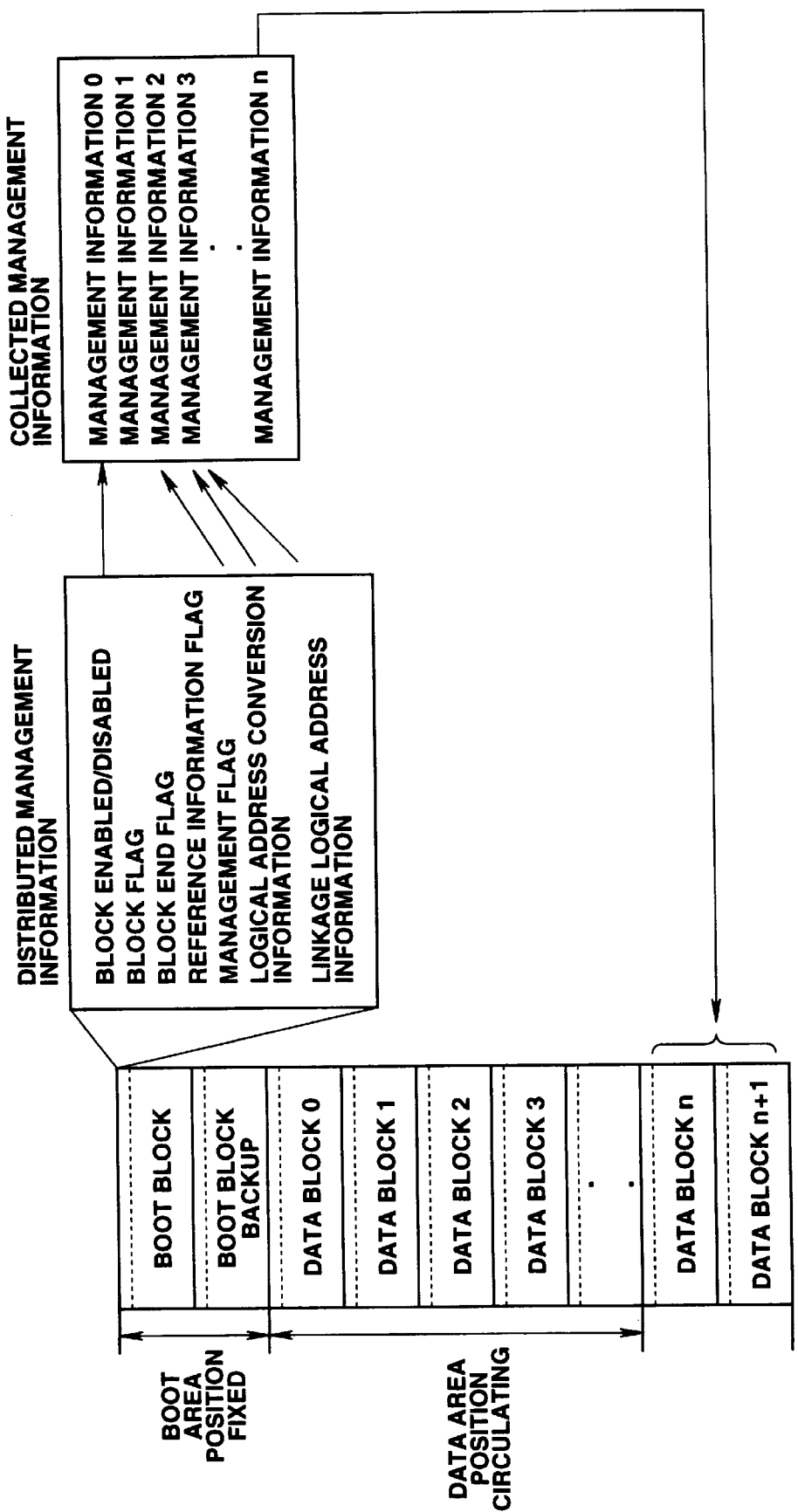
FIG. 3 explains a block configuration of a flash memory of the aforementioned memory card.

Here, the aforementioned flash memory 22a to 22d is a NAND type. As shown in FIG. 3, this flash memory 22 consists of a plurality of blocks including a boot area of 2 blocks, a data area made from a plurality of blocks, and an area having a collected management information (collected management file) over a plurality of blocks.

The boot area includes a boot block and a boot block backup, each in a single block. The boot block is a block containing a first data to be read out, for example, an address of a block containing a data for identifying the block and a collected management information. Moreover, the boot block backup is a copy of the boot block so as to be used, for example, when the boot block is destroyed.

The data area is used to store various data such as a video data and an audio data. The area containing a collected management information stores a collected management -information consisting of data for management of information required for access.

Here, each of the blocks consists of a predetermined number of pages, each page (=528 bytes) consisting of a main data area for storing a main data of 512 bytes and a redundant area of 16 bytes. The redundant area stores a distributed management information indicating the storage stage of the page and the like.

Figure 4:
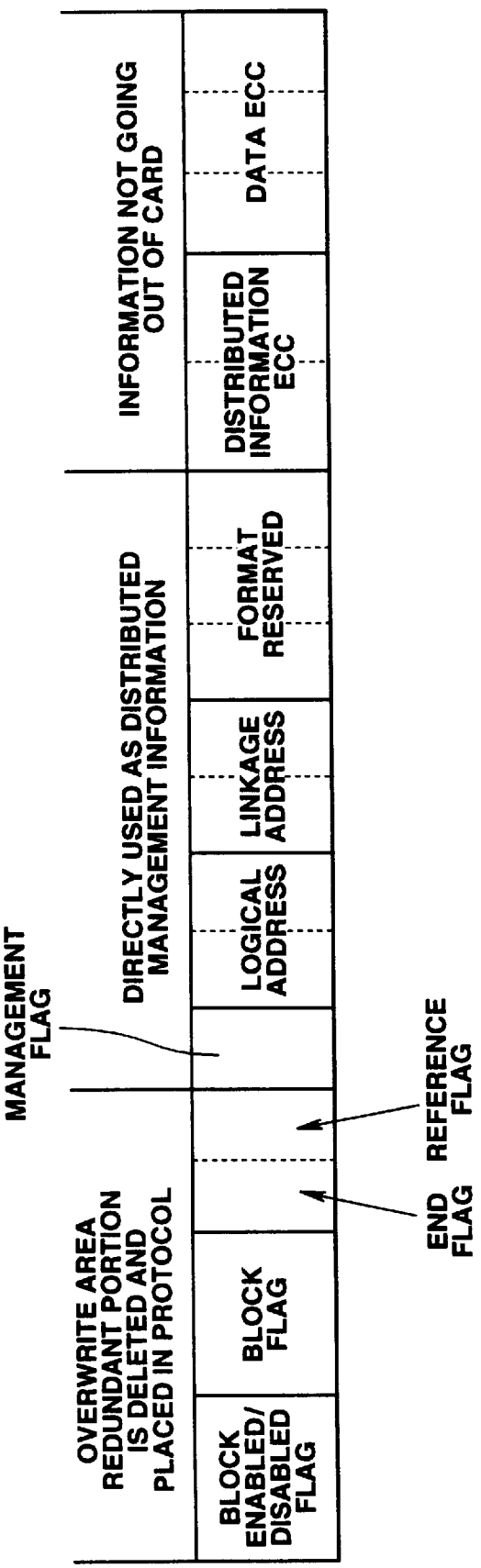
FIG. 4 explains contents of a distributed management information of one page of a block of the aforementioned flash memory.

FIG. 4 shows a distributed management information of each page including: block enabled/disabled information (1 byte); block flag (1 byte); block end flag (4 bytes); reference flag (4 bits); management flag (1 bytes); logical address (2 bytes); linkage address (2 bytes); format reserve (3 bytes); distributed information ECC (2 bytes); and data ECC (3 bytes).

The "block enabled/disabled information" is an information indicating whether the block is in a usable state. For example, if the block is destroyed and cannot be used, the "block enabled/disabled information" is overwritten, so as to indicate that the block cannot be used. The "block flag" indicates that no data has been written in the block, i.e., the block is not in use; or the block is used as a file head; or the block is used by other than a file head; or when the block has become unnecessary because of erase or rewrite, the block is set to a used state so as to be erased later. The "block end flag" indicates whether the block is an end block when a plurality of blocks constitute one file. It should be noted that when the "block end flag" indicates that the block is an end block, the "linkage address" becomes invalid even if specified. The "reference flag" is a flag specifying reference of an additional information which will be detailed later. This additional information exists on the last page of the block. The "management flag" is an information of 1 byte. Three bits (bits 2 to 0) of the one byte is stored in a collected management information table, whereas the remaining 5 bits are not stored in the collected management table but are used for an error correction processing and the like. The "logical address" indicates a logical address of the block. The "linkage address" indicates a logical address of a block to be linked with this block. It should be noted that when the block is already known to be an end block, the "block end flag" is turned on, so that "0xffff" set is in the "linkage address". When this block is not known whether to be an end block, a logical address is assigned and set in the "linkage address".

When this block is to become an end block, overwrite is executed and the "block end flag" is turned on. The "format reserve" is an information of 3 bytes for use as a reserved area. The "distributed information ECC" is used for correcting an error of the "management flag", "logical address", "linkage address", and the "format reserve". The "data ECC" is used for correcting an error of a data other than the distributed management information.

Figure 5:
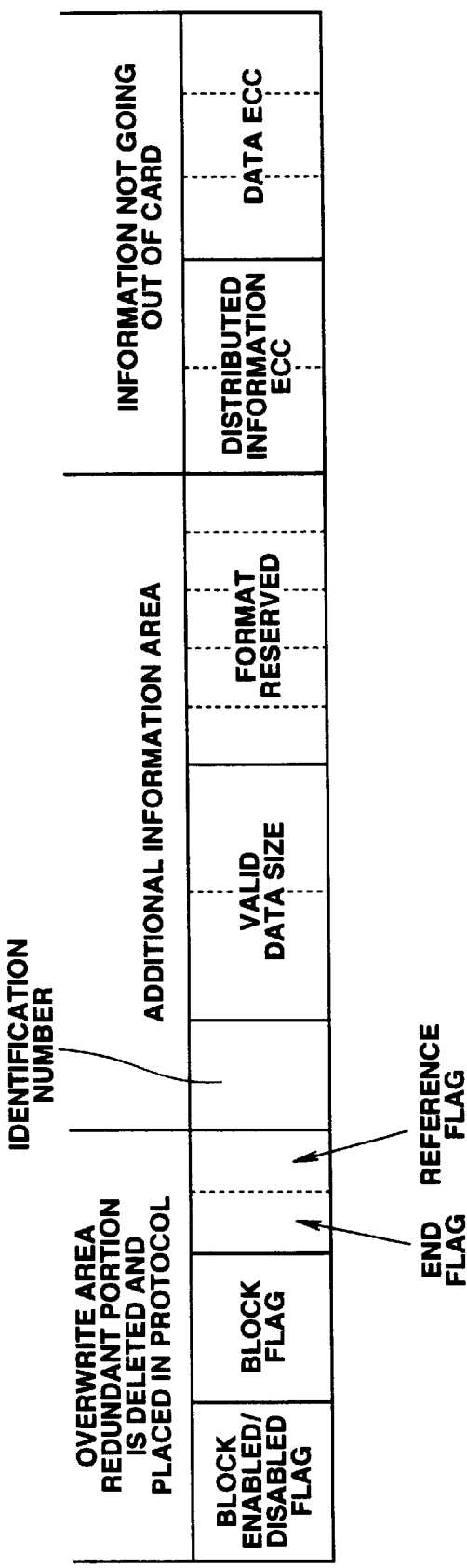
FIG. 5 explains contents of a distributed management information used as an additional information.

It should be noted that a distributed management information on the last page of each block is used as an additional information. As shown in FIG. 5, the additional information includes an overwrite area and an additional management information area. The overwrite area is identical to the aforementioned distributed management information. The additional management information area includes: identification number (1 bytes); valid data size (2 bytes); and format reserve (5 bytes). The "identification number" is used for rewriting a file, so as to identify an original file and a destination when updating by using an identical logical block. When a new logical address is used, "0" is written, and the value is incremented when update is executed. The "valid data size" indicates a size of a valid data within the block. For example, if the block has no empty area, "0xffff" is written and the "reference flag" is turned on, describing the block valid data size−1.

Figure 6:
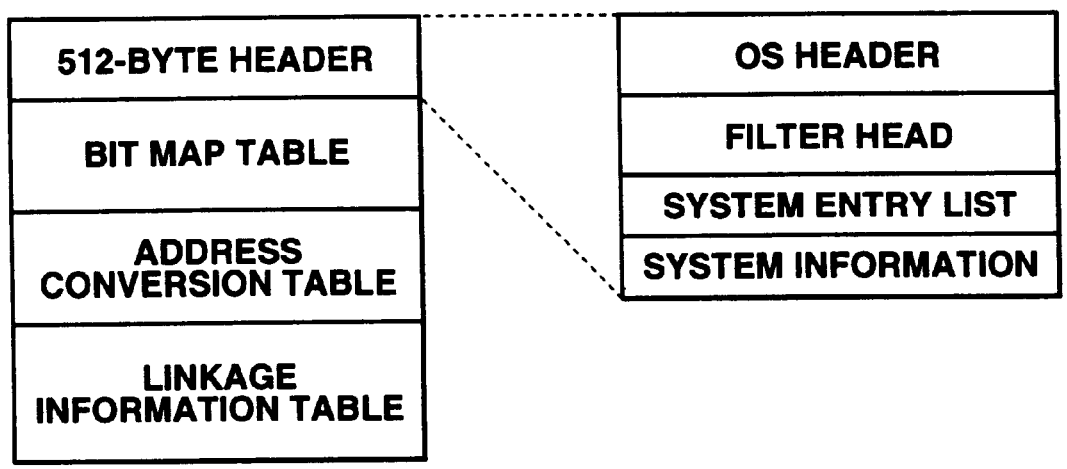
FIG. 6 explains a configuration of a collected management file.

Moreover, a collected management information is constituted according to distributed management information of respective blocks. As shown in FIG. 6, the distributed management information consists of: a header containing a start position information for searching an empty area in respective blocks of the flash memory 22a to 22d; a bit map table, an address conversion table, and a linkage information table. The header includes an OS header, file header, system entry list, and system information.

FIG. 7 shows the OS header having: file ID (2 bytes); file version (2 bytes); file size (4 bytes); number of blocks in use (2 bytes); number of links (1 bytes); date (8 bytes); manufacturer/model code (4 bytes); initial loading directory number (2 bytes); number of keywords loaded (1 byte); keyword character code (1 byte); keyword character string (32 bytes); file name (11 bytes); 0 reset reserve (4 bytes); and individual data (32 bytes).

The "file size" indicates the entire size of the collected management file in the number of bytes. The "number of blocks in use" indicates the number of blocks using the collected management file in the flash memory 22a to 22d. The "number of links" indicates the number of links when the collected management file is in a reference relation with (linked to) other files. The "date" indicates a data when the collected management file is created or updated. The "manufacturer/model code" indicates the manufacturer and the model of an apparatus which has written the collected management file into the memory card 20. The "initial loading directory number" is described as "0xffff" without any definition. The "number of keywords loaded" and the "keyword character code" are set to "0". The "keyword character string" is all set to "0". The "file name" is used when carrying out management of the collected management file, and not used within the memory card 20. The "0 reset reserve" is always set to 0 when executing a rewrite. The "individual data" is all "0".

FIG. 8 shows the file header including: specification identification data (8 bytes); file specification identification data (8 bytes); file ID (2 bytes); file version (2 bytes); date of application created (8 bytes); date of application updated (8 bytes); creation manufacturer/model code (4 bytes); updating manufacturer/model code (4 bytes); 0 reset reserve (16 bytes); number of data entries (1 byte); number of tables (1 bytes); character code (1 byte); title character string (128 bytes); and a reserved area (48 bytes).

The "specification identification data" indicates the the flash memory 22a to 22d stores a collected management file according to a predetermined specification. The "file specification identification data" indicates that the collected management file has been created according to the aforementioned predetermined specification. The "file ID" indicates a file type, and the same is contained in the OS header. The "file version" indicates a version number. The "date of application created" indicated a date when the collected management file is created, whereas the "date of application updated" indicates the date of updating. The "creation manufacturer/model code" indicates the manufacturer and the model name which has created the collected management file, whereas the "updating manufacturer/model code" indicates a manufacturer and model name which has updated the collected management file. The "number of data entries" indicates a number of entries which will be detailed later, and the number is 3 in a collected management file. The "number of tables" indicates a number of data items in a table data area, and the number is "0" here. The "character code" indicates an input character with a predetermined code number, and it is "0xff" here. The "title character string" indicates title characters, which are all "0xff" FIG. 9 shows the system entry list consisting of 4 sets of 12-byte data (entries), each set including: start address (4 bytes); data size (4 bytes); data type ID (1 byte); and reserved (3 bytes). In other words, the system entry list executes management of up to four entries. It should be noted that a collected management file, excluding a header, has a bit map table, an address conversion table, and a linkage information table, and accordingly, contains an information required for management of these three tables.

For example, for a bit map table, the "start address" indicates an address of the start position of the bit map table, and the "data size" indicates a number of blocks required for the bit map table. The "data type ID" describes "0x03" indicating a bit map table. It should be noted that an identical configuration is used for the address conversion table and the linkage information table.

FIG. 10 shows a configuration of the system information including: empty block search position (2 bytes) and an reserved area (94 bytes). The "empty block search position" serves to store a search position of an empty block.

On the other hand, as shown in FIG. 11, the bit map table is used for management of in-use state of the flash memory 22a to 22d on block basis and contains a head information other attribute information for management of blocks. More specifically, as shown in FIG. 11, the bit map table contains in the physical address order of blocks, an 8-bit information consisting of: enabled/disabled (1 bit); block flag (2 bits); block end flag (1 bit); reference flag (1 bit); system flag (1 bit); read only (1 bit); and marking (1 bit).

The "enabled/disabled", "block flag", "block end flag", and "reference flag" are respectively identical to "block enabled/disabled information", "block flag", "block end flag" of the distributed management information. That is, "enabled/disabled" indicates whether the block can be used. The "block flag" indicates whether the block is not in use; used as a head block; used other than as a head block; in used and waiting for erase. The "block end flag" indicates whether the block is continuous to another block in one file or an end. The "reference flag" indicates whether an additional management information contains an item to be referenced. It should be noted that the "system flag" indicates whether the block is for an ordinary application or a block for the system. The "read only" indicates whether the block is enabled for read-out/write-in or the block is dedicated for read-out. The "marking" indicates whether the block is an ordinary block or block for marking, and in a case of marking, a reference of the distributed management information is specified.

FIG. 12 shows a configuration of the address conversion table, containing in the logical address order of blocks, physical address of respective blocks. That is, in the address conversion table, block physical addresses are described so as to correspond to the logical addresses written in the distributed management information of the respective blocks. This enables to carry out all-at-once management of conversion between the physical address and the logical address. It should be noted that "0xffff" is described for the physical address of a block not in use.

FIG. 13 shows a configuration of the linkage information table which contains, in the block logical address order, a linkage address of the distributed management information corresponding to respective blocks as the "linkage logical address". It should be noted that the "linkage logical address" is described as "0xffff" if the block is a final block, and as "0x0000" if the logical address is not in use. Moreover, the logical address 0 is dedicated for a route directory and linkage to this is inhibited.

Figure 14:
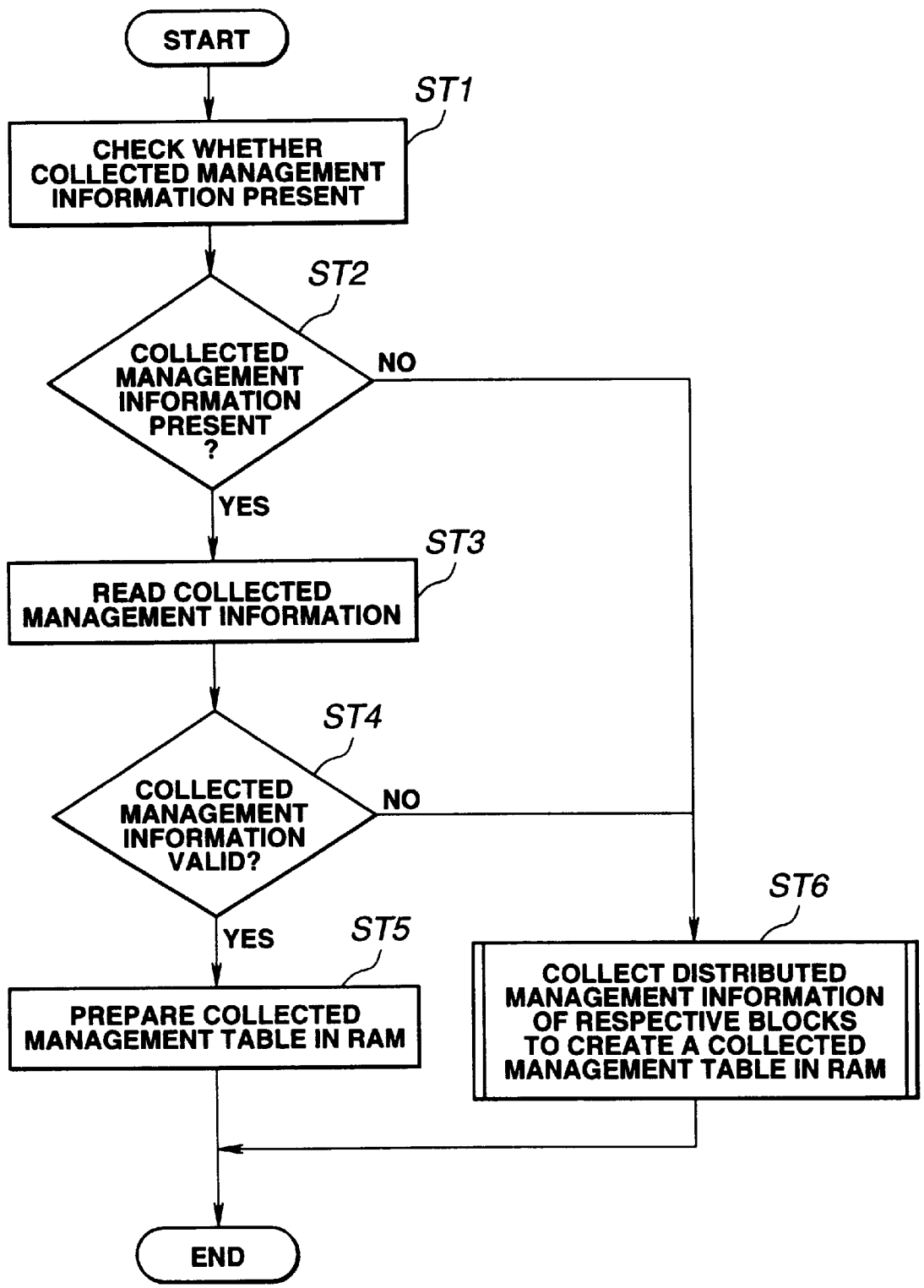
FIG. 14 is a flowchart showing a processing executed when a host computer is started.

In the memory card system 1 having the aforementioned configuration, when the CPU 17 of the host computer 10 is started, as shown in FIG. 14, the CPU 17 reads out information of the boot block from the flash memory 22a to 22d of the memory card 20 and determines whether a collected management information is contained (step ST1 and step ST2). It should be noted that in this process, the memory card 20 is also substantially activated, but here, explanation will be given along the processing in the host computer 10.

If the CPU 17 decides that a collected management information is contained, the collected management file is read from the flash memory 22a to 22d into the RAM 12 (step ST3). Furthermore, the CPU 17 decides whether the collected management information which has been read in is valid (step ST4). If the collected management information is decided to be valid, the CPU 17 creates a collected management table in the RAM 12 so as to be used for memory management (step ST5). This collected management table is used for management of data in the flash memory 22a to 22d.

Thus, if no error is contained in a collected management information of the memory card 20, the CPU 17 of the host computer 10, when activated, can reads out the collected management information so as to carry out management of the data in the flash memory 22a to 22d. This enables to carry out a high-speed processing in a short time after activation.

On the other hand, if the CPU 17, in step ST2, decides that no collected management information is contained, or if in step ST4, decides that the collected management information is not valid, the CPU 17 collects distributed management information stored in the distributed management information areas of respective blocks, so as to constitute a collected management information by creating a collected management table within the storage means (step ST6).

Figure 15:
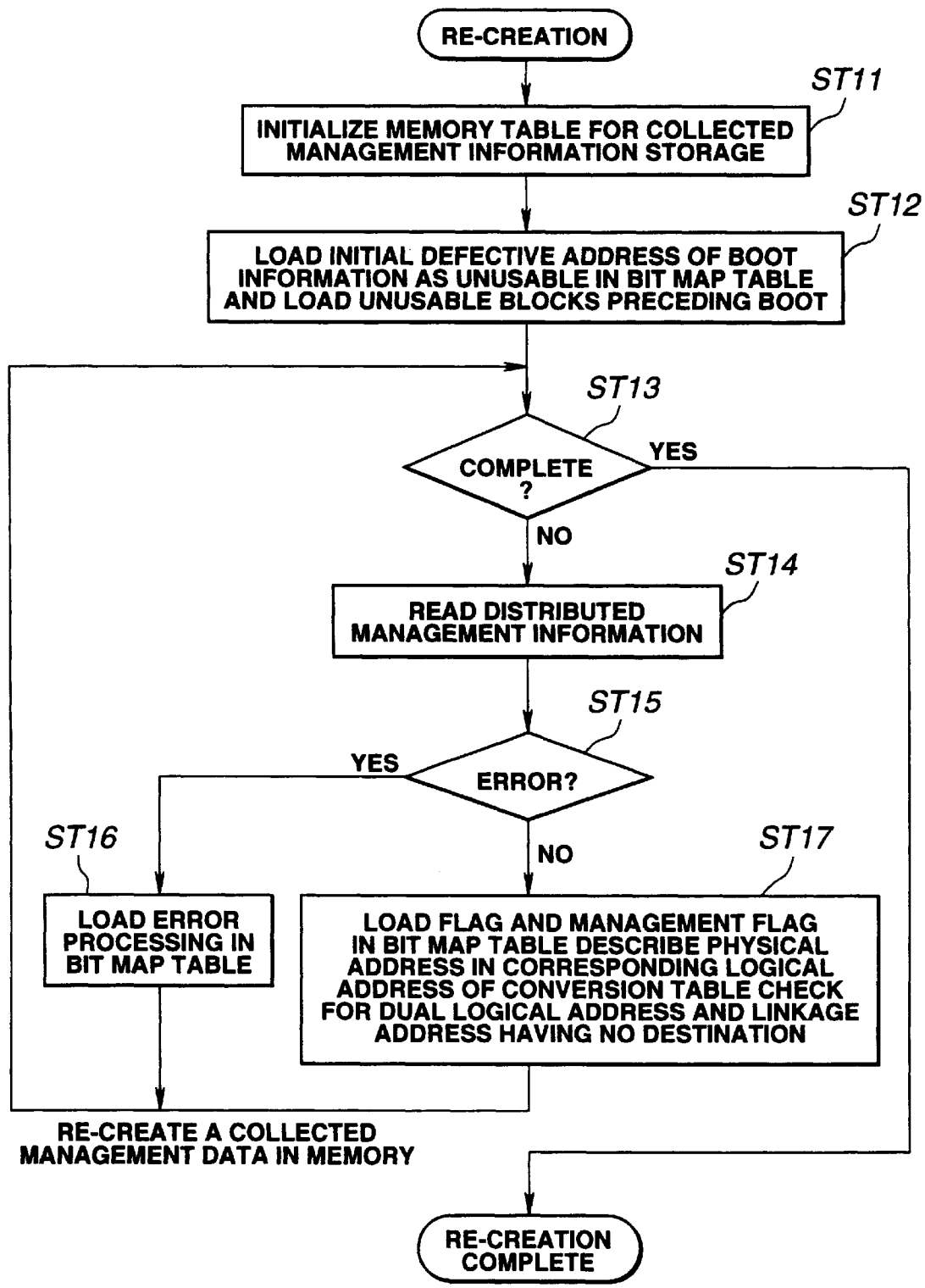
FIG. 15 is a flowchart showing a processing executed when the host computer is started.

More specifically, step ST6 executes a subroutine processing shown in FIG. 15. The CPU 17 of the host computer 10 initializes the memory table for storing a collected management information (step ST11) and loads an initial defective address of the boot block as unusable in the bit map table, as well as an unusable block preceding the boot block as unusable (step ST12). Blocks after the boot block are successively checked and it is decided whether check of all the blocks is complete (step ST13).

When it is decided that check of all the blocks is not complete, the CPU 17 reads out a distributed management information of one block from the flash memory 22a to 22d and stores it in the RAM 12 (step ST14). After this, it is decided whether an error is contained in the distributed management information which has been read out (step ST15). If any error is found, it is loaded in the bit map table that an error is caused in the block (step ST16).

Moreover, when it is decided that no error is contained in the distributed management information which has been read out, the CPU 17 loads the management flag of the distributed management information, in the bit map table, describes a physical address of the block in the corresponding logical address of the address conversion table, and further describes a linkage information in the corresponding logical address of the linkage information table (step ST17). Thus, a content of the distributed management information of the block is described in the bit map table, in the address conversion table, and in the linkage information table. Moreover, the CPU 17 also checks whether any dual logical address or linkage address having no destination is contained (step ST17).

After the CPU 17 has described a content of a distributed management information of the block in the bit map table, in the address conversion table, and in the linkage information table in the aforementioned steps ST13 to ST15 and ST17, control is returned to step ST13 for describing contents of distributed management information of other blocks in the bit map table and the like. When read-out of distributed management information of all the blocks is complete, i.e., check of all the blocks is complete (step ST13), the CPU 17 adds a 512-byte header to the data consisting of the bit map table, the address conversion table, and the linkage information table, so as to create a collected management file in the RAM 12, thus completing the creation of the collected management information. Thus, when no collected management information is present or when a collected management information is not valid, the distributed management information is used to create a collected management file.

In this process, the CPU 17 may re-store the collected management table in the RAM 12 as a collected management information in the collected management information storage area of the flash memory 22a to 22d during a period when no predetermined computation processing is to be carried out such as upon power OFF.

Thus, the CPU 17 can execute management of data according to the collected management information stored in the RAM 12 with the flash memory 22a to 22d, which enables to carry out management of a data read-out or write-in easily and at a high speed. Furthermore, when no collected management information is present or a collected management information is not valid, it is possible to read out a distributed management information from the flash memory 22a to 22d, so as to create a collected management information to be used for management. Consequently, even when a distributed management information is destroyed, it is possible to execute a data management, which increases the reliability.

More specifically, by creating a bit map table, the CPU 17 can recognize an unusable block according to the bit map table of the collected management information, without searching the distributed management information of all the blocks. This enables to execute a data write-in at a higher speed. Moreover, it is possible to know that each of the blocks is a head block or an intermediate block or a block containing no data. This also enables to execute a file write-in or read-out at a high speed.

Moreover, by creating an address conversion table for example, the CPU 17 can execute conversion from a logical address to a physical address at a high speed, thus reducing the access time to the flash memory 22a to 22d.

Furthermore, by creating a linkage information logical address, the CPU 17 can easily recognize the blocks constituting a file and read out at a high speed a file consisting of a plurality of blocks.

Figure 16:
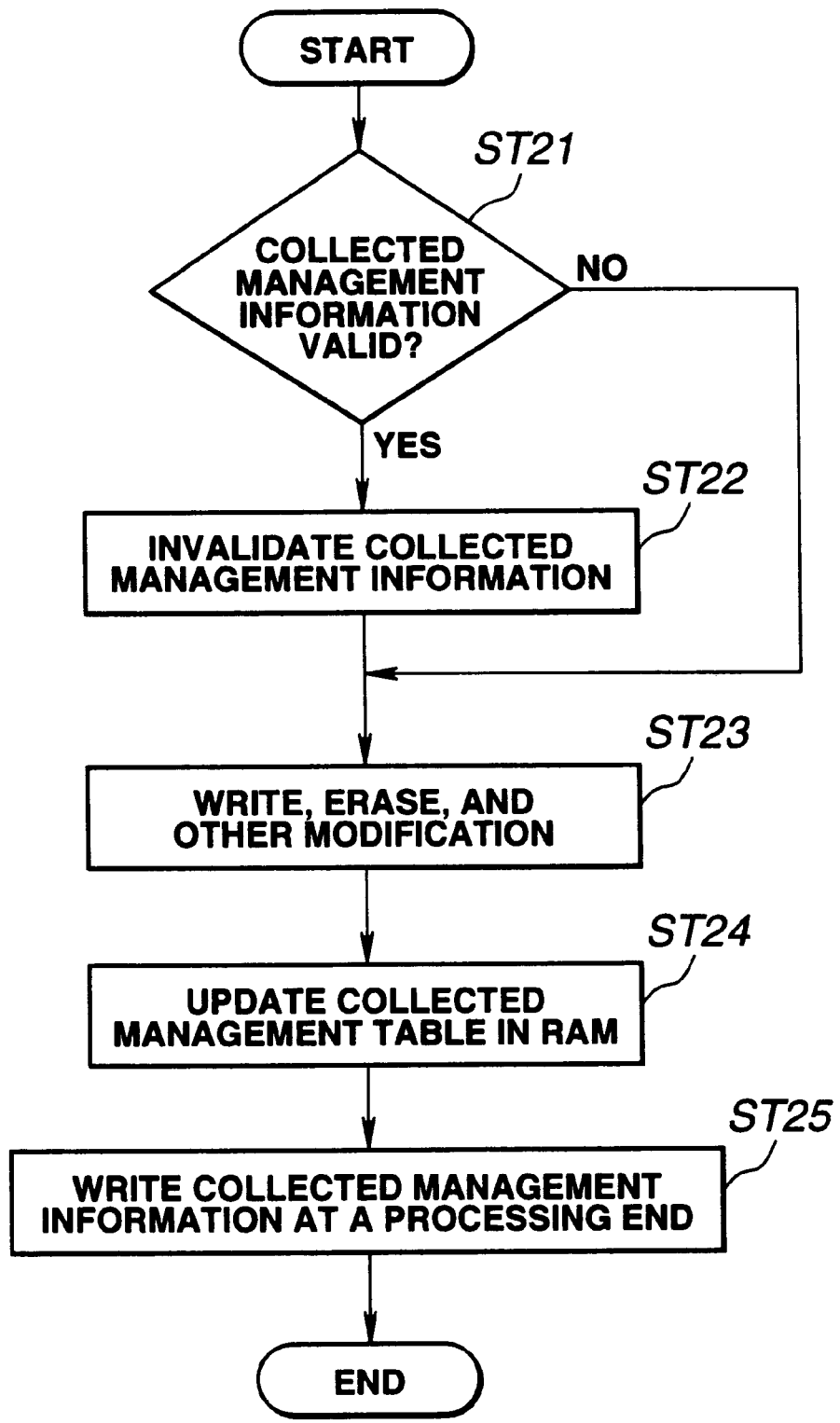
FIG. 16 is a flowchart showing a processing of a data write or a data erase.

Next, description will be directed to a processing of the CPU 17 for writing a video data write into the memory card 20 with reference to FIG. 16.

When writing a new data in the flash memory 22a to 22d or when erasing a data in the flash memory 22a to 22d, the CPU 17 decides whether the collected management information stored in the RAM 12 is valid (step ST21). More specifically, it is decided whether a part of the collected management information need be modified according to the distributed management information corresponding to the new data.

When the collected management information is decided to be valid, the CPU 17 executes a processing to invalidate the collected management information in the RAM 12 (step ST22) and writes a new video data in the flash memory 22a to 22d or a data modification processing such as erase of the video data already stored (step ST23). Note that if the collected management information is decided not to be valid in step ST21, a modification processing such as a video data write-in is executed (step ST23).

The CPU 17 updates a part of the collected management information in the RAM 12 (step ST24) according to the distributed management information corresponding to the new video data which has been written in or the distributed management information of a block in which a video data or the like has been erased.

At computation processing end such as immediately before power OFF, the CPU 17 writes the collected management information stored in the RAM 12 in the collected management information storage area of the flash memory 22a to 22d (step ST15).

That is, when a data write-in or erase has caused modification in the collected management information, the CPU 17, according to the distributed management information f the written data or the like, updates the collected management information, so that the collected management information is always matched with the distributed management information, thus assuring the reliability of the video data management. Moreover, by writing the obtained collected management information in the flash memory 22a to 22d at an appropriate moment, it is possible to execute other computation processing with a higher priority, thus enhancing the entire computation processing speed.

Figure 17:
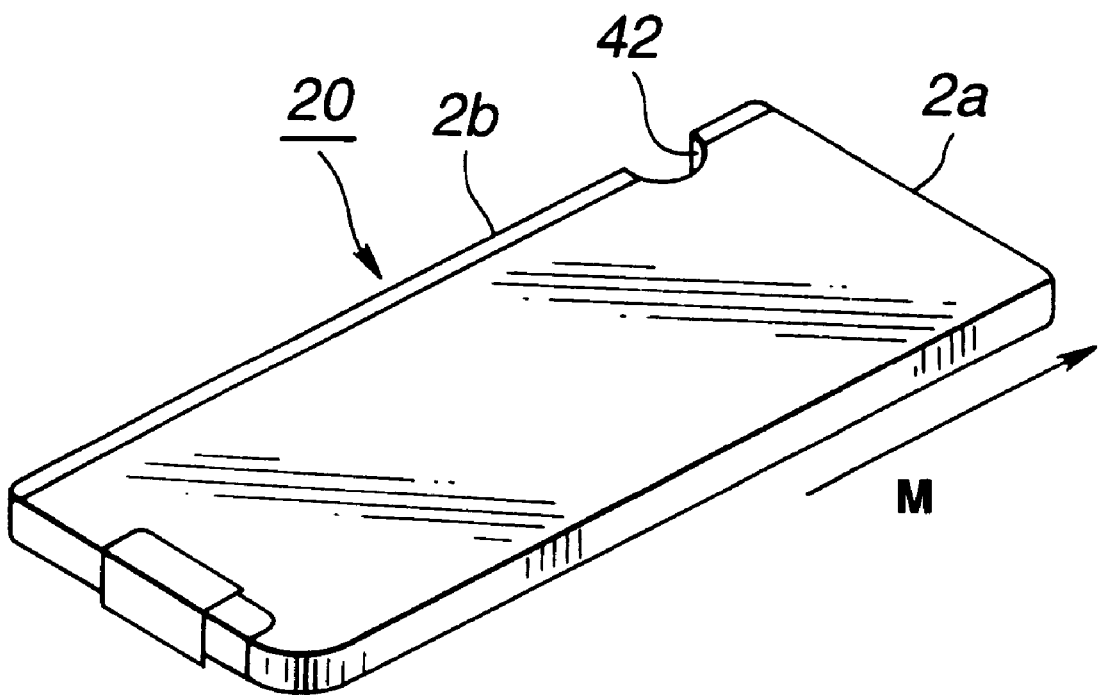
FIG. 17 shows an external perspective view of a memory card according to the present invention.

It should be noted that the memory card in the present embodiment, for example, may have an external configuration as shown in FIG. 17 in a flat thin card shape made from a synthetic resin.

In the aforementioned memory card 20, for example, an external terminal (not depicted) is formed at one side 2a in the longitudinal direction, so that the memory card 20 can be mounted on an electronic apparatus (not depicted) in the direction indicated by the arrow M in the figure.

Moreover, in the aforementioned memory card 20, it is possible to form a lock cut-off portion at one side parallel to the mounting direction, for example, so that when the memory card 20 is mounted on an electronic apparatus (not depicted), a lock convex (not depicted) of the electronic apparatus is engaged with the lock cut-off portion so as to prevent removal of the memory card 20 from the electronic apparatus.

That is, the memory card 20 in the present embodiment has both of a collected management information stored in a collected management information storage area and a distributed management information stored in a distributed management storage area of the flash memory 22a to 22d as storage means. By carrying out management of these information items according to the data management method of the present invention, when an error is detected in the collected management information, the host computer 10 searches respective distributed management information stored in the distributed management information storage area, so as to create a collected management information for use; and if the collected management information is destroyed, it is possible to easily create one. Thus, there is no such danger that the entire data read-out and/or write-in cannot be executed. That is, the system is tough for destruction.

Furthermore, if a modification such as erase and rewrite is caused to the distributed management information stored in the distributed management information storage area in the flash memory 22a to 22d of the memory card 20, the host computer 10 updates the collected management information according to the modified distributed management information to be stored in distributed management information storage and stores the updated information in the collected management information storage area in the flash memory 22a to 22d of the memory card 20. Thus, there will be no difference between the distributed management information and the collected management information in the memory card 20.

Furthermore, when the host computer 10 is activated next time, the host computer searches the aforementioned re-created and re-stored in the memory card as a collected management information, which enables to activate the host computer 10 in a reduced time, which in turn enables a high-speed processing.

In a case when the re-storing processing of a collected management information by the host computer 10 in the memory card 20 is interrupted, it is assumed that no collected management information exists. In this case, upon activation of the host computer 10 next time, a processing is carried out, assuming that no collected management information is present.

Moreover, in a case when a distributed management information is destroyed in the memory card 20, it becomes impossible to execute a data read-out and/or read-out from/ to a corresponding block, but a damage of the memory card 20 as a whole can be minimized.

It should be noted that the explanation above has been given on a case of a memory card for a serial interface, but the data management apparatus according to the present invention can also be used for a parallel interface.

What is claimed is:

1. A data management method comprising the steps of:
   storing data in a data storage area constituted by a plurality of predetermined storage units;

storing in a distributed management information storage area distributed management information for management of said data on a basis of said predetermined storage units;

storing in a collected management information storage area collected management information for management of said data according to said distributed management information;

determining upon activation whether said collected management information is valid; and managing said data one of according to said collected management information when said collected management information is determined to be valid and according to said distributed management information when said collected management information is determined to be invalid.

2. The data management method as set forth in claim 1, wherein when said collected management information is not valid, updated collected management information is created by said management means from said distributed management information stored in said distributed management information storage area and said updated collected management information is stored in said storage means.

3. The data management method as set forth in claim 2, wherein when predetermined data processing is executed, said updated collected management information is stored in said storage means after said predetermined data processing is complete.

4. The data management method as set forth in claim 1, wherein when new data is written in said data storage area of said storage means causing a modification to a part of said collected management information, said collected management information is updated according to distributed management information of said new data and said updated collected management information is stored in said distributed management information storage area.

5. The data management method as set forth in claim 1, further comprising the steps of:

storing said distributed management information including one of a plurality of management flags for management of a storage state of said plurality of predetermined storage units and said collected management information including said plurality of management flags of said plurality of predetermined storage units; and managing data storage in said data storage area according to said collected management information.

6. The data management method as set forth in claim 1, further comprising the steps of:

storing said distributed management information having a respective plurality of logical addresses of said plurality of predetermined storage units and said collected management information constituted by a plurality of physical addresses of said plurality of predetermined storage units and a plurality of corresponding logical addresses; and converting between said physical address and said logical address of a respective one of said plurality of predetermined storage units according to said collected management information, so as to perform one of reading data stored in said storage area and storing new data.

7. The data management method as set forth in claim 1, further comprising the steps of:

storing said distributed management information including linkage information indicating that one of said plurality of predetermined storage units is to be linked to another of said plurality of predetermined storage units and said collected management information inculding a plurality of linkage information items of said plurality of predetermined storage units; and reading from said storage means according to said collected management information data stored in a data storage area linked with said one of said plurality of predetermined storage units.

8. A data management apparatus comprising:

storage means for storing data in a data storage area constituted by a plurality of predetermined storage units, for storing in a distributed management information storage area thereof distributed management information for management of said data on a basis of said predetermined storage units, and for storing in a collected management information storage area thereof collected management information for management of said data according to said distributed management information; and management means for determining upon activation whether said collected management information is valid, wherein when said collected management information is determined to be valid, management of said data is performed according to said collected management information, and when said collected management information is determined to be invalid, management of said data is performed according to said distributed management information.

9. The data management apparatus as set forth in claim 1, wherein when said collected management information is not valid, said management means creates updated collected management information from said distributed management information stored in said distributed management information storage area, and writes said updated collected management information created by said management means in said storage means.

10. The data management apparatus as set forth in claim 1, wherein when new data is written in said data storage area of said storage means causing a modification to a part of said collected management information, said storage means updates said collected management information according to distributed management information of said new data and writes updated collected management information in said storage means.

11. The data management apparatus as set forth in claim 10, wherein when predetermined data processing is executed, said management means writes said updated collected management information in said storage means after said predetermined data processing is complete.

12. The data management apparatus as set forth in claim 1, wherein said storage means stores said distributed management information including one of a plurality of management flags for management of a storage state of one of said plurality of predetermined storage units and said collected management information including said plurality of management flags of said plurality of predetermined storage units, and said management means performs management of data storage in said data storage area according to said collected management information.

13. The data management apparatus as set forth in claim 1, wherein said storage means stores said distributed management information including one of a plurality of logical addresses of one of said plurality of predetermined storage units and said collected management information including a plurality of physical addresses of said plurality of predetermined storage units and a plurality of corresponding logical addresses, and said management means executes a conversion between one of said plurality of physical addresses and one of said plurality of logical addresses of said one of said predetermined storage units according to said collected management information and one of reads out data stored in said storage means and writes data into said storage means.

14. The data management apparatus as set forth in claim 1, wherein said storage means stores said distributed management information including linkage information indicating that one of said plurality of predetermined storage units is to be linked to another of said plurality of predetermined storage units and said collected management information including a plurality of linkage information items of said plurality of predetermined storage units, and said management means reads from said storage means data stored in a data storage area linked with said one of said plurality of predetermined storage units according to said collected management information.

15. A recording medium for storing data comprising:

a data recording area constituted by a plurality of predetermined storage units for storing said data; and a collected management information storage area for storing collected management information for management of said data according to said distributed management information.

16. The recording medium as set forth in claim 15, wherein said recording medium stores said distributed management information having a management flag for management of a storage state of one of said plurality of predetermined storage units and said collected management information constituted by a set of management flags of said plurality of predetermined storage units.

17. The recording medium as set forth in claim 15, wherein said recording medium stores said distributed management information having a logical address of one of said plurality of predetermined storage units and said collected management information constituted by a set of physical addresses of said plurality of predetermined storage units and a plurality of corresponding logical addresses.

18. The recording medium as set forth in claim 15, wherein said recording medium stores said distributed management information having linkage information indicating a linkage of one of said plurality of predetermined storage units to another of said plurality of predetermined storage units and said collected management information constituted by a set of linkage information items of said plurality of predetermined storage units.

* * * * *